United States Patent
Mundt

(10) Patent No.: US 6,582,619 B1
(45) Date of Patent: Jun. 24, 2003

(54) METHODS AND APPARATUSES FOR TRENCH DEPTH DETECTION AND CONTROL

(75) Inventor: Randall S. Mundt, Pleasanton, CA (US)

(73) Assignee: Lam Research Corporation, Milpitas, CA (US)

( * ) Notice: Subject to any disclaimer, the term of this patent is extended or adjusted under 35 U.S.C. 154(b) by 0 days.

(21) Appl. No.: 09/409,843

(22) Filed: Sep. 30, 1999

(51) Int. Cl.[7] .............................. B44C 1/22; C03C 15/00
(52) U.S. Cl. ........................... 216/83; 216/88; 356/484; 356/504
(58) Field of Search .................. 216/83, 88, 89; 356/504, 484

(56) References Cited

U.S. PATENT DOCUMENTS

| | | |
|---|---|---|
| 4,900,940 A | 2/1990 | Nakamura |
| 5,405,488 A | 4/1995 | Dimitrelis et al. ........... 156/627 |
| 5,499,733 A | 3/1996 | Litvak ..................... 216/38 |
| 5,695,660 A | 12/1997 | Litvak ..................... 216/85 |
| 5,898,500 A | 4/1999 | Canteloup et al. |
| 5,926,277 A | 7/1999 | Marron et al. |
| 5,952,135 A * | 9/1999 | Ghandehari et al. ........... 430/22 |
| 5,982,489 A * | 11/1999 | Shiraishi .................... 356/355 |

FOREIGN PATENT DOCUMENTS

| | | |
|---|---|---|
| EP | 0 352 740 | 1/1990 |
| JP | 01235807 | 9/1989 |

OTHER PUBLICATIONS

Takada et al., "Development of Trench Depth Measurement System for VLSI Dynamic Random Access Memory Vertical Capacitor Cells Using an Interferometric Technique with a Michelson Interferometer", Aug. 15, 1998, Applied Optics, Optical Society of America, vol. 28, No. 15, pp. 3373–3381.

* cited by examiner

Primary Examiner—Robert Kunemund
Assistant Examiner—Duy-Vu Deo
(74) Attorney, Agent, or Firm—Martine & Penilla, LLP

(57) ABSTRACT

An inventive method for optically detecting a trench depth in a wafer is disclosed. The method includes detecting a first maxima in the intensity of a multi-wavelength light source, a portion of the light being reflected from the top trench surface of a wafer. A second maxima is then detected in the intensity of the multi-wavelength light source, a portion of which being reflected from the bottom trench surface of a wafer. The method further includes determining a maxima peak difference between the first maxima and the second maxima, wherein the trench depth corresponds to the maxima peak separation. The invention provides a robust, cost effective method for trench depth detection.

6 Claims, 6 Drawing Sheets

METHODS AND APPARATUSES FOR TRENCH DEPTH DETECTION AND CONTROL

BACKGROUND OF THE INVENTION

The present invention relates to the fabrication of semiconductor integrated circuits (IC's). More particularly, the present invention relates to methods and apparatuses for determining wafer trench depth.

One of the operations in the fabrication of IC's is the etching of trenches into the surface of silicon wafers. This etch operation is typically performed using well known photolithography and plasma etch technology. Generally, the desired depth of these trenches ranges from about 0.1 microns to 3.0 microns with control of the precise depth of the trench being an important consideration.

During the plasma etch process, the etch rate can vary as a function of etching variables such as the chamber component temperature, the chamber conditioning, and the wafer resist age. Improved trench depth control can result if this "process drift" can be monitored and compensated.

Currently, there are several well know optical techniques used to measure the depths of trenches etched into silicon, such as spectral reflectometery, monochromatic interference, laser triangulation, confocal imaging, and phase contrast.

While these methods are potentially usable, each of them is limited in some way by the physics and specific limitations of the techniques. For example, the interpretation of spectral reflectometery data requires either a prior knowledge of: film thickness', materials, and refractive indexes, or, complex and error prone "fitting" techniques. The inaccuracies in the optical modeling techniques used are reflected as errors in the calculated etch depth. A change or drift in the refractive index of a film could be interpreted as an error in the trench depth and an erroneous control action taken. A trench depth monitoring capability that is excessively sensitive to extraneous variables may actually result in increased variability, and therefore error rate.

In view of the foregoing, what are needed are improved methods and apparatuses for detecting etch trench depth. Further, the methods should be sensitive only to distance, measure an average depth over a reasonable area, and be compact, robust, and cost effective.

SUMMARY OF INVENTION

The present invention addresses these needs by providing an optically based trench depth detection method. In one embodiment, a first maxima is detected in the intensity of a multi-wavelength light source, a portion of the light being reflected from the top trench surface of a wafer. A second maxima is then detected in the intensity of the multi-wavelength light source, a portion of which being reflected from the bottom trench surface of a wafer. The method further includes determining a maxima peak difference between the first maxima and the second maxima, wherein the trench depth corresponds to the maxima peak separation.

In another embodiment, a system for optically detecting a trench depth is disclosed. The optical trench depth detection system includes a multi-wavelength light source for providing multi-wavelength light to a wafer. The system further includes a light detector for detecting reflected multi-wavelength light. Preferably, the light detector is configured such that it will detect a first maxima in the light intensity from the multi-wavelength light source, a portion of which being reflected from the top trench surface of the wafer. In addition, the light detector is preferably configured such that it will detect a second maxima in the light intensity from the multi-wavelength light source, a portion of which is reflected from the bottom trench surface of the wafer trench. The system is further configured such that the separation between the first maxima and the second maxima corresponds to the trench depth of the wafer trench.

In yet another embodiment of the present invention a method for making an integrated circuit having an optically detectable trench depth is disclosed. The method comprises introducing a substrate into a processing chamber, and creating a plasma within the chamber. A first maxima is then detected in the light intensity of multi-wavelength light, wherein a part of the light is reflected from the top trench surface of a wafer. A second maxima is then detected in the light intensity of multi-wavelength light, a part of which is reflected from the bottom trench surface of a wafer. The method further includes determining a maxima peak difference between the first maxima and the second maxima, wherein the trench depth corresponds to the maxima peak separation. The substrate is etched until the maxima peak separation corresponding to a predetermined trench depth occurs. Thereafter, the substrate is processed through a series of semiconductor processes to form the integrated circuit.

Advantageously, the use of a direct separation measurement technique by the present invention provides a more accurate and robust measurement than techniques using parameter sensitive models.

BRIEF DESCRIPTION OF THE DRAWINGS

The invention, together with further advantages thereof, may best be understood by reference to the following description taken in conjunction with the accompanying drawings in which.

DETAILED DESCRIPTION OF INVENTION

An invention is disclosed for optically detecting a trench depth in a wafer using white light. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
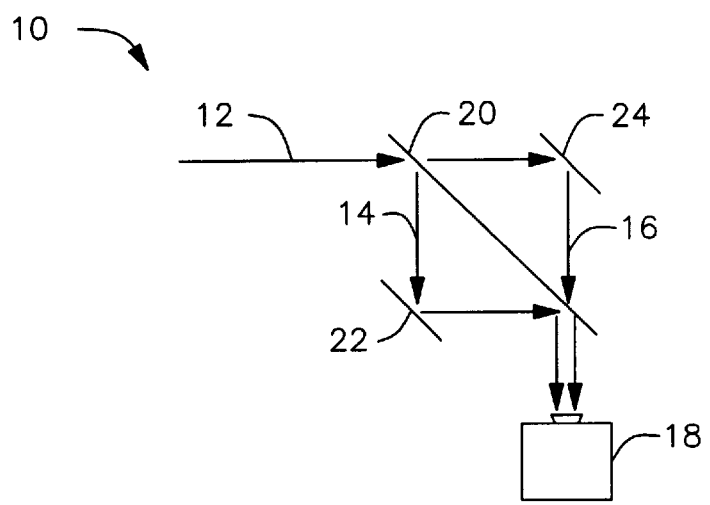
FIG. 1 is an illustration showing a light model of two light paths, in accordance with an embodiment of the present invention.

FIG. 1 is an illustration showing a light model 10 of two light paths, in accordance with an embodiment of the present invention. The light model 10 includes an initial light path 12, a first light path 14, a second light path 16, and a light detector 18. Also included in the light model 10 are a beam splitter 20, a first reflector 22, and a second reflector 24. In operation, light along the initial light path 12 is divided into light paths 14 and 16 by beam splitter 20. Light along the first light path 14 travels to detector 18 utilizing the first reflector 22, while light along the second light path 16 travels to detector 18 using the second reflector 24.

Figure 2:
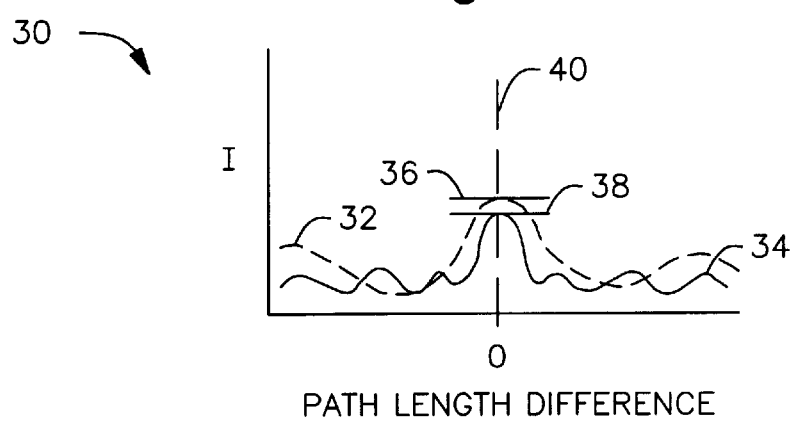
FIG. 2 is a graph showing the intensity of monochromatic light as a function of the path length difference between the first and second light paths, in accordance with an embodiment of the present invention.

Depending on the type of light used, light detector 18 will generate different light intensities as the lengths of the first and second light paths 14 and 16 are varied in relation to one another. FIG. 2 is a graph 30 showing the intensity of monochromatic light as a function of the path length difference between the first and second light paths 14 and 16, in accordance with an embodiment of the present invention. Included in graph 30 are the intensities of red monochromatic light 32, the intensities of blue monochromatic light 34, a maxima of the intensities of the red monochromatic light 36, and a maxima of the intensities of the blue monochromatic light 38.

As shown in FIG. 2, the intensity of monochromatic light varies as the path length difference varies. However, at the point of zero path difference 40, by definition there is a maxima in monochromatic light intensity. For monochromatic light, this maxima may be repeated at other path length differences, for example whenever the wavelength period of each path is in phase. However, only at the point of zero path difference 40 is there a maxima at all light wavelengths.

Figure 3:
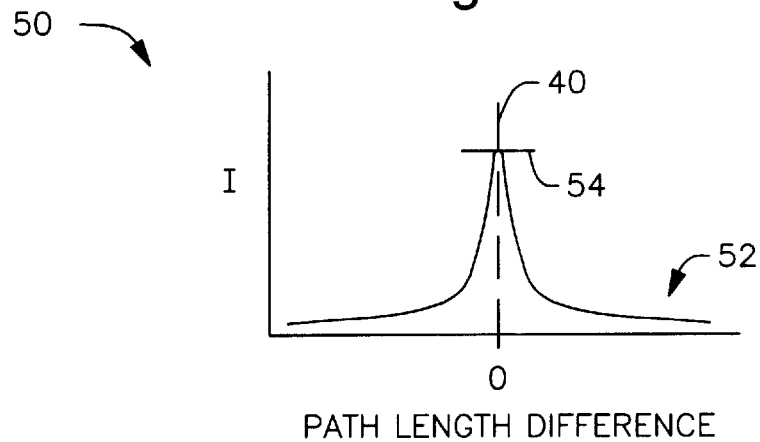
FIG. 3 is a graph showing the intensity of white light as a function of the path length difference between the first and second light paths, in accordance with another embodiment of the present invention.

FIG. 3 is a graph 50 showing the intensity of white light as a function of the path length difference between the first and second light paths 14 and 16, in accordance with an embodiment of the present invention. Included in graph 50 are the intensities of the white multi-wavelength light 52, and a maxima of the white multi-wavelength light 54. Since, as described above, all light wavelengths have a maxima at the point of zero path difference 40, they all constructively interfere at the point of zero path difference 40, thus producing maxima 54. At any other point of path difference, some of the wavelengths will constructively interfere, while others will destructively interfere at the detector 18. Thus, there is only one maxima 54 for the white multi-wavelength light, and it occurs at the point of zero path difference 40. All other points along graph 50 are substantially lower in magnitude than maxima point 54. Therefore, maxima 54 appears as an easily distinguishable sharp peak on graph 50.

Figure 4:
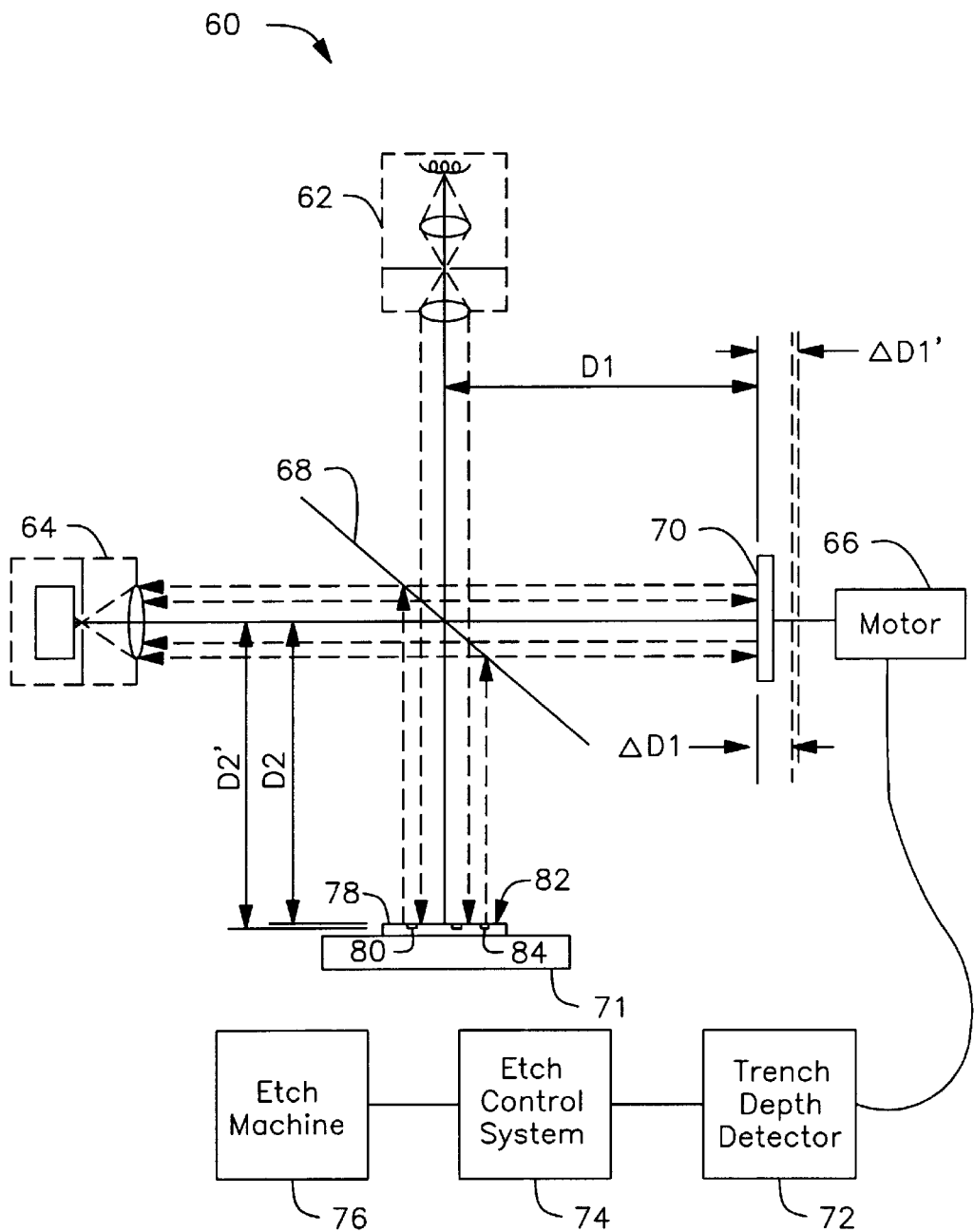
FIG. 4 is an illustration showing trench depth detector system, in accordance with an embodiment of the present invention.

Because multi-wavelength white light produces an easily distinguishable sharp peak on an intensity graph when two recombined light path lengths are equal, the present invention uses multi-wavelength white light to determine trench depth. FIG. 4 is an illustration showing a trench depth detector system 60, in accordance with an embodiment of the present invention. The trench depth detector system 60 includes a white light source 62, a light detector 64, a motor system 66, a beam splitter 68, and a movable mirror 70. Further included in the trench depth detector system 60 is an electrostatic chuck 71, a trench depth detector 72, an etch control system 74, and an etch machine 76. Disposed above the electrostatic chuck 71 is a wafer 78 including trenches 80. The wafer 78 further includes two surfaces, a top trench surface 82, and a bottom trench surface 84.

Distance D1 is the distance between the beam splitter 68 and an initial location of the mirror 70. Distance ΔD1 is the distance between D1 and a second location of the movable mirror 70. Thus, distance ΔD1 is a measure of the movement of the movable mirror 70. Trench top distance D2 is the distance between the beam splitter 68 and the top trench surface 82, while trench bottom distance D2' is the distance between the beam splitter and the bottom trench surface 84. Thus, the difference between distance D2' and distance D2 is the trench depth.

In use, the white light source 62 applies white light to the wafer 78 through the beam splitter 68. The white light then travels along two separate paths to the light detector 64. A first path travels from the wafer 78 to the light detector 64, while a second path travels from the mirror 70 to the light detector 64.

The first and second light paths recombine at the beam splitter 68 before traveling to the light detector 64. Thus, the distance between the beam splitter 68 and the light detector 64 is the same for both light paths.

When distance D1+ΔD1 is essentially equal to trench top distance D2 light at all wavelengths will constructively interfere at the light detector 64 producing a first easily distinguishable sharp peak on an intensity graph. Similarly, when D1+ΔD1' is essentially equal to trench bottom distance D2' light at all wavelengths will also constructively interfere at the light detector 64 producing a second easily distinguishable sharp peak on an intensity graph. Thus, by moving the mirror 70 across a range greater than or equal to the trench depth, two maximas in the intensity of the reflected white light will be detected by light detector 64. A first maxima occurring when D1+ΔD1 equals D2, and a second maxima occurring when D1+ΔD1' equals D2'.

Figure 5:
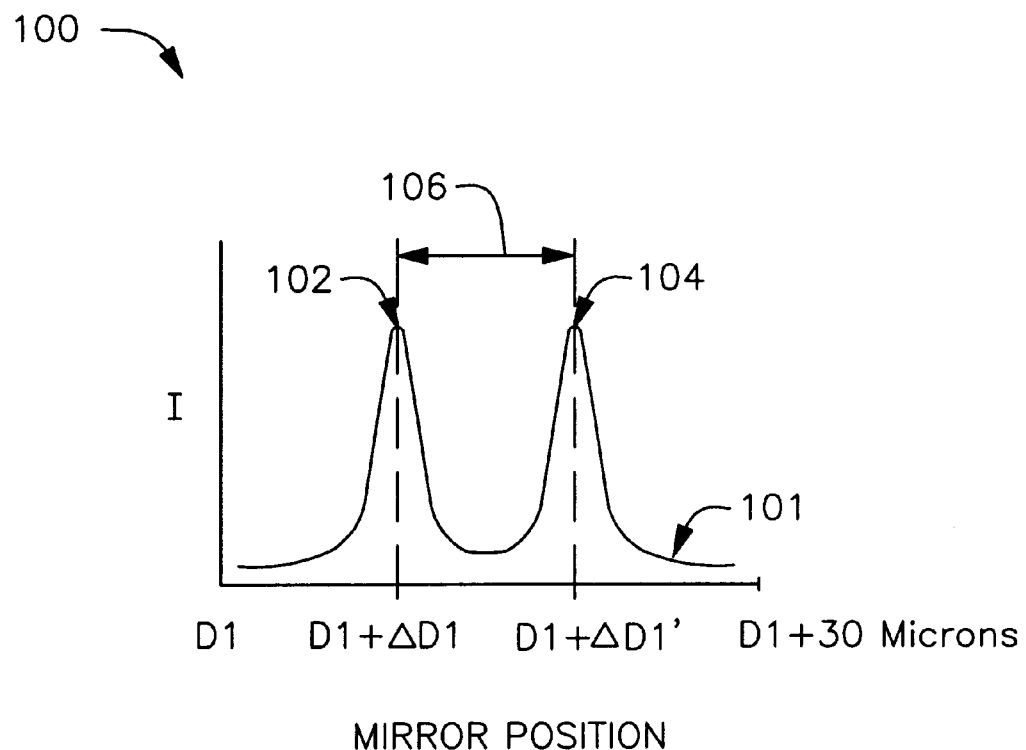
FIG. 5 is a graph showing the intensity of the white light detected by the light detector as a function of the position of the movable mirror, in accordance with an embodiment of the present invention.

FIG. 5 is a graph 100 showing the intensity of the white light 101 detected by the light detector 64 as a function of the position of the movable mirror 70, in accordance with an embodiment of the present invention. The graph 70 includes various intensities of white light 101, a first and second intensity maxima 102 and 104, and a peak distance 106. Intensity maxima 102 occurs when distance D1+ΔD1 essentially equals distance D2, while intensity maxima 104 occurs when distance D1+ΔD1' essentially equals distance D2'. It should be borne in mind that the order of occurrence of the maxima may be interchanged, depending on the initial mirror placement. The peak distance 106 is the difference between the intensity maxima 102 and 104.

The peak distance 106 corresponds to the trench depth. More particularly, the distance traveled by the mirror 70 between maxima peaks 102 and 104 is the trench depth. Thus, the trench depth can be monitored by calculating the difference between the location of the mirror 70 when maxima peak 102 occurs, and the location of the mirror 70 when maxima peak 104 occurs. Referring back to FIG. 4, the trench detector system 60 may be utilized to monitor of trench depth post etch, or to control etch time during etch. If used as to control etch time, the movement of the movable mirror 70 is monitored and analyzed by a trench depth detector 72. Analyzed data from the trench depth detector 72 is then transmitted to an etch control system 74, which controls an etch machine 76. In this manner, the etch time can be automated to end when the trench depth reaches a predetermined depth. The trench depth detector 72 typically receives mirror movement data from the motor system 66.

Preferably, the motor system is calibrated by measuring the white light peak difference of a known sample step height as measured in step pulses, capacitance difference, or voltage difference. The type of motor used determines which calibration measurement to use, for example, stepper motors use step pulses as a measurement of mirror movement.

Figure 6A:
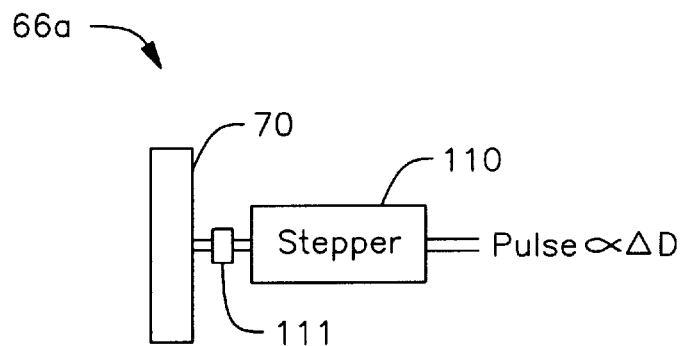
FIG. 6A is an illustration showing a stepper motor system, in accordance with one embodiment of the present invention.

FIG. 6A is an illustration showing a stepper motor system 66a, in accordance with one embodiment of the present invention. The stepper motor system 66a includes a stepper motor 110 and rotation to translation mechanism 111. In use, the stepper motor 110 moves a given distance, or rotates a given angle, for each input pulse, thus moving the mirror 70. As will be apparent to those skilled in the art, the number of input pulses used between the white light intensity peaks 102 and 104 on graph 100 will correspond to the trench depth.

Figure 6B:
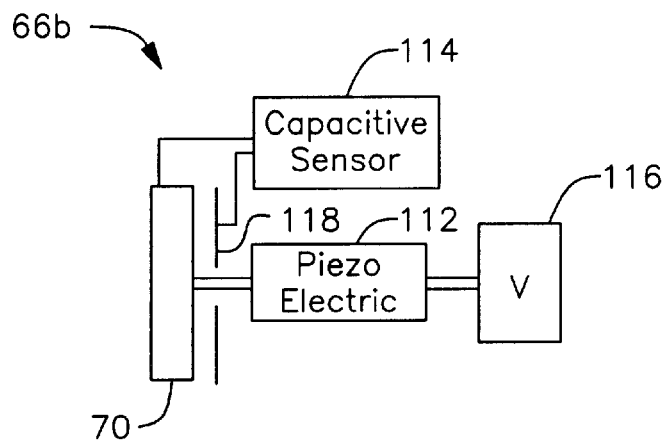
FIG. 6B is an illustration showing a sensor piezoelectric motor system, in accordance with another embodiment of the present invention.

FIG. 6B is an illustration showing a sensor piezoelectric motor system 66b, in accordance with another embodiment of the present invention. The sensor piezoelectric motor system 66b includes a piezoelectric motor 112, a capacitive sensor 114, and a voltage source 116. The movable mirror 70 utilized with the piezoelectric motor system 66b is preferably a metallic front reflective movable mirror. The capacitive sensor 114 includes a capacitive plate 118 disposed behind mirror 70, creating a mirror capacitor with the metallic front reflective movable mirror 70. In use, the capacitive sensor 114 senses the capacitance of the mirror capacitor at varying locations of the movable mirror 70. Thus, the difference in capacitance between the white light intensity peaks 102 and 104 on graph 100 will correspond to the trench depth.

Figure 6C:
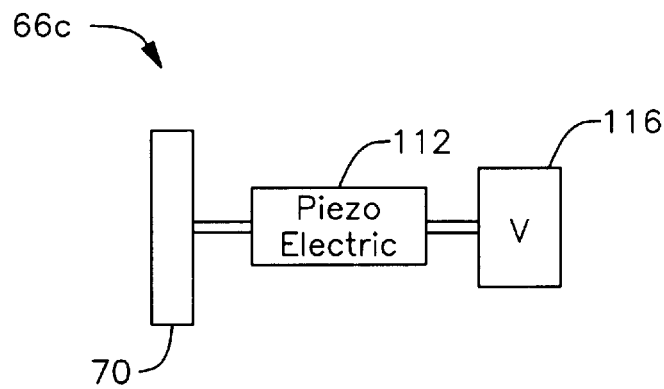
FIG. 6C is a illustration showing a piezoelectric motor system, in accordance with another embodiment of the present invention.

FIG. 6C is a illustration showing a piezoelectric motor system 66c, in accordance with another embodiment of the present invention. The piezoelectric motor system 66c includes a piezoelectric motor 112, and a voltage source 116. In use, the driving voltage produced by the voltage source 116 is correlated to the mirror position. More particularly, the difference between in driving voltage between the white light intensity peaks 102 and 104 on graph 100 will correspond to the trench depth.

Figure 7:
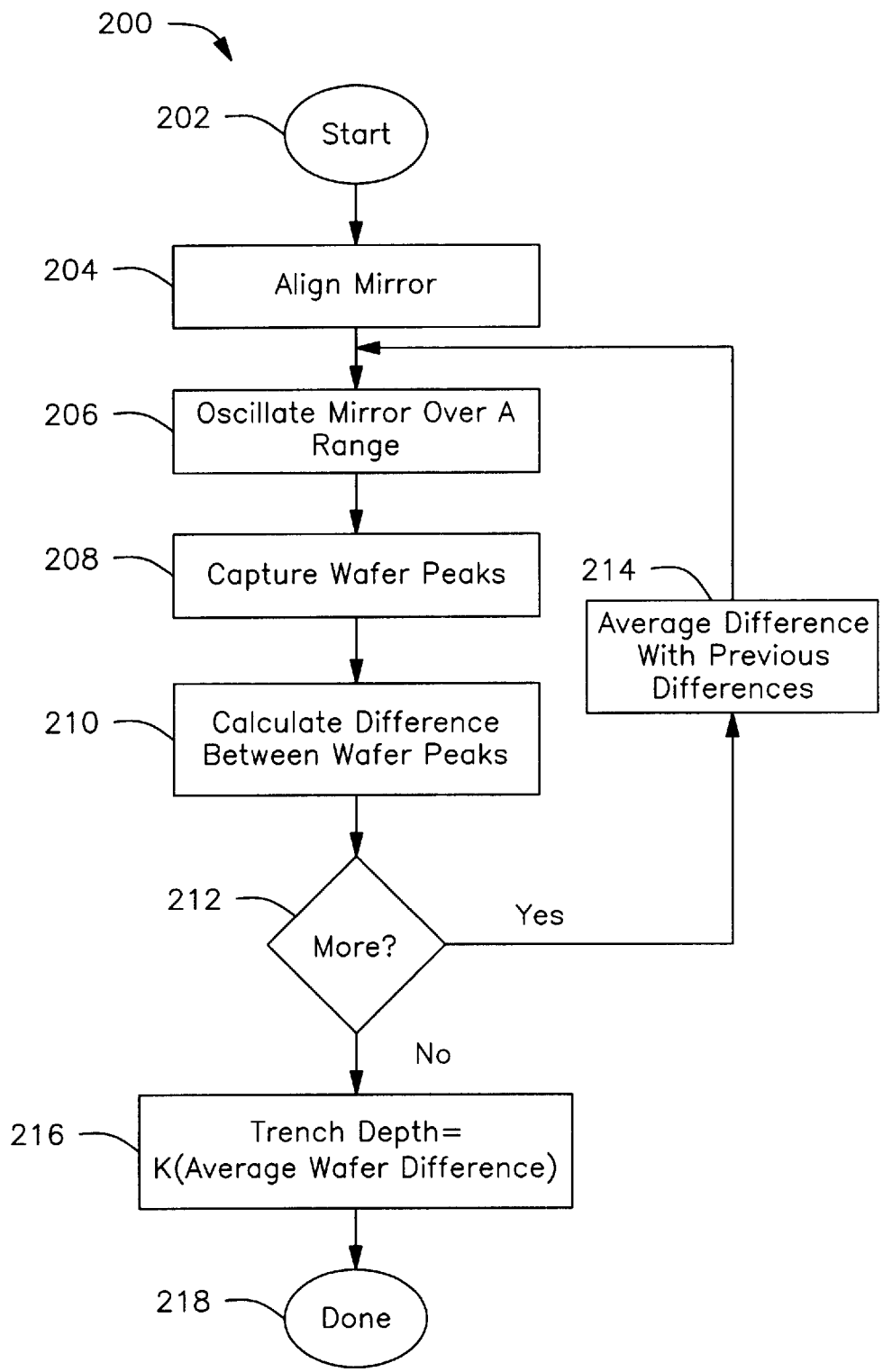
FIG. 7 is a flowchart showing a method for optically detecting a trench depth on a wafer, in accordance with one embodiment of the present invention.

FIG. 7 is a flowchart showing a method 200 for optically detecting a trench depth on a wafer, in accordance with one embodiment of the present invention. In an initial operation 202, the wafer is prepared for trench depth detection. Wafer preparation may include, for example, placing the wafer onto an electrostatic chuck, and other pre-process operations, as will be apparent to those skilled in the art.

In an alignment operation 204, the movable mirror, which is used to vary the second light path length, is aligned. The movable mirror is preferably positioned normal to the wafer surface. Mirror alignment includes rotating the movable mirror through a range to determine the best angle for light path reflection. In this manner, the white light peak maxima may be increased in magnitude to a desired level.

Next, in a mirror oscillation operation 206, the movable mirror is oscillated over a range. The larger the range of movement, the larger the placement tolerance of the wafer. However, the larger the range of movement, the more movement there is to resolve into sub-micron distances, thus the detection problem increases in complexity. Thus, the range of movement is determined by how accurate the placement of the wafer may be performed without undue complexity and expense.

Preferably, the range of movement is at least one order of magnitude greater than the trench depth, and more preferably at least is two orders of magnitude, and most preferably at least three orders of magnitude greater than the trench depth. Generally, not more than 1 mm of movement range is required.

In a capture operation 208, white light intensity maxima peaks are captured. For each oscillation of the moveable mirror, two intensity maxima peaks will occur. As described with reference to FIG. 5, one intensity maxima occurs when the path length of the light path from the mirror to the light detector essentially equals the path length of the light path from the top trench surface to the light detector. A second intensity maxima occurs when the path length of the light path from the mirror to the light detector essentially equals the path length of the light path from the bottom trench surface to the light detector. The two maxima peaks are used to calculate trench depth, subsequently.

The mirror is preferably moved over the range at a relatively fast speed to reduce inaccuracies do to machinery vibration. However, only movement occurring between the two maxima peaks will affect the measurement of trench depth. Movement occurring at any other time will only cause the maxima peaks to move together, and therefore the relative distance between the peaks will remain constant. Thus, if the mirror is moved at a relatively fast speed, little vibration motion will occur between the two maxima peaks. Preferably, the oscillations are greater than 50 Hz, more preferably greater than 100 Hz, and most preferably the oscillations are greater than 1000 Hz.

In a calculation operation 210, the difference between the two maxima peaks, as measured in mirror movement, is calculated. The distance the movable mirror travels between the two maxima peaks directly corresponds to the trench depth. Thus, by calculating the position of the mirror at each maxima peak, the distance the mirror traveled can be determined, and therefore the trench depth can be determined. As noted above, preferably, the motor system is calibrated by measuring the white light peak difference of a known sample step height. This measurement is typically measured in step pulses, capacitance difference, or voltage difference, the motor type determining which calibration measurement to use. Thus, by pre-process calibrating of the motor system, the maxima peak difference may be more easily correlated into mirror movement.

To obtain a more accurate trench depth measurement, more than one measurement of trench depth is preferably obtained. Thus, a decision is then made as to whether more trench depth measurements are required, in operation 212. If more trench depth measurements are required, the method 200 continues to operation 214. If not, the method 200 continues to operation 216.

In an averaging operation 214, the calculated differences are averaged. The current calculated difference from operation 210 is averaged with any previous calculated differences. In this manner, a more accurate determination of trench depth may be determined because measurement inaccuracies are generally averaged out over a large sample size. The method 200 then continues with the oscillation operation 206.

When there are no more trench depth measurements to be made, the method 200 continues with a final trench depth calculation operation 216. The final trench depth is calculated to be the average trench depth when multiplied by an appropriate calibration factor, as determined by the calibration of the instrument.

Finally, in operation 218, The final calculated trench depth can be used to monitor trench depth in wafer production. The final calculated trench depth can also be used to control etch time by transmitting the trench depth data to an etch control system controlling an etch machine. In this manner, the etch time can be automated to end when the trench depth reaches a predetermined depth.

Figure 8:
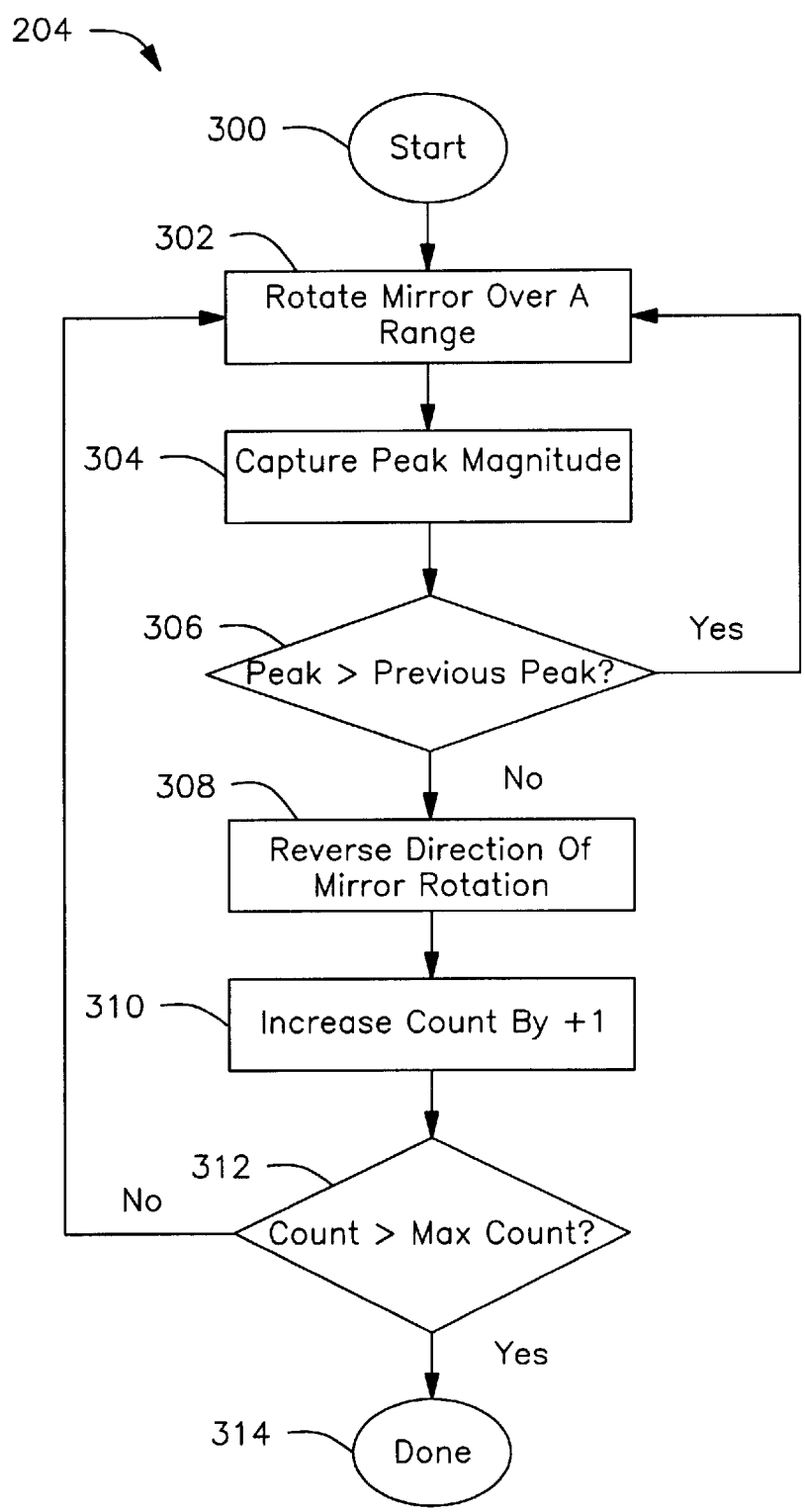
FIG. 8 is a flowchart showing a method for aligning a movable mirror to maximize light intensity maxima peaks, in accordance with an embodiment of the present invention.

FIG. 8 is a flowchart showing a method 204 for aligning a movable mirror to increase light intensity maxima peaks, in accordance with an embodiment of the present invention. In an initial operation 300, the mirror and wafer are prepared for trench depth detection. Mirror and wafer preparation may include determining an initial placement of the mirror, placing the wafer onto an electrostatic chuck, and other pre-process operations, as will be apparent to those skilled in the art.

In a mirror rotation operation 302, the movable mirror is rotated over a range. The rotation is performed to determine what mirror angle will result in the largest magnitude of the white light intensity maxima peaks. Higher intensity maxima peaks allow for easier trench depth detection. Thus, to increase performance of the trench depth detection system, the movable mirror is aligned to maximize the magnitude of the intensity maxima peaks.

In a capture operation 304, the magnitude of a white light intensity maxima peak is captured. At this point in the trench depth detection, only the magnitude of an intensity maxima peak is required. The delta between the intensity maxima peaks is not needed at this point because the trench depth is not determined until later in the trench depth detection process, see FIG. 7.

A decision is then made as to whether the latest captured peak is greater than the previous captured peak, in operation 306. If the latest captured peak is greater than the previous captured peak, the method 204 continues with mirror rotation operation 302. In this case, the magnitude of the intensity maxima is still increasing, indicating the maximum magnitude may not yet have been reached. If the latest captured peak is less than the previous captured peak, the method 204 continues with operation 308.

In a reversing operation 308, the direction of mirror rotation is reversed from the previous rotation direction. If, in operation 306, the latest captured peak is less than the previous captured peak, the maximum magnitude for the intensity maxima peak has been reached. Thus, the direction of mirror rotation is reversed to re-capture the maximum magnitude for the intensity maxima peak.

Next, in a count operation 310, a counter is increased by one. Every time operation 308 occurs, the maximum magnitude for the intensity maxima peak has been reached. During operation of method 204, the mirror rotation travels back and forth across the intensity maxima peak. When this occurs a predetermined number of times, the method 204 determines that the best alignment for the moveable mirror has been reached. Thus, the method 204 tracks the number of times the intensity maxima peak has been encountered.

A decision is then made as to whether the counter is greater than a maximum count number, in operation 312. If the counter is less than the maximum count number, the method 204 continues with mirror rotation operation 302. In this case, more mirror adjustment may be necessary for to attain the maximum magnitude for the intensity maxima peak. If the counter is greater than or equal to the maximum count number, the method 204 continues with operation 314.

Finally, the aligned mirror may be used for trench depth detection, in operation 314. Once the maximum count number has been reached, essentially the best alignment for the moveable mirror has been reached, and the method 204 is complete. As mentioned previously, higher intensity maxima peaks allow for easier trench depth detection. Thus, to increase performance of the trench depth detection system, the movable mirror is aligned to maximize the magnitude of the intensity maxima peaks.

While the present invention has been described in terms of several preferred embodiments, there are many alterations, permutations, and equivalents which may fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A system for optically detecting a trench depth, the system comprising:

a multi-wavelength light source suitable for applying multi-wavelength light to a portion of a wafer; and a light detector suitable for detecting multi-wavelength light from the light source, wherein the light detector is configured to detect:

a first maxima in an intensity of multi-wavelength light, a portion of the multi-wavelength light being reflected from a top trench surface; reflector location corresponds to the first maxima; and a second maxima in an intensity of multi-wavelength light, a portion of the multi-wavelength light being reflected from a bottom trench surfaces, reflector location corresponds to the maxima;

wherein a maxima peak separation between the first maxima and the second maxima corresponds to the trench depth.

2. A system as recited in claim 1, wherein the light detector is configured to detect:

multi-wavelength light reflected from the top trench surface along a first top trench light path; and multi-wavelength light along a second top trench light path, wherein the first maxima occurs when a length of the first top trench light path and a length of the second top trench light path are essentially equal.

3. A system as recited in claim 2, wherein the light detector is configured to detect:

multi-wavelength light reflected from the bottom trench surface along a first bottom trench light path; and multi-wavelength light along a second bottom trench light path, wherein the second maxima occurs when a length of the first bottom trench light path and a length of the second bottom trench light path are essentially equal.

4. A system as recited in claim 3, wherein the reflector includes a movable mirror, wherein the multi-wavelength light along the second top trench light path and the second bottom trench light path is reflected from the movable mirror.

5. A system as recited in claim 4, wherein the movable mirror is capable of moving over a range to vary the length of second top trench light path and the length of the second bottom trench light path.

6. A system as recited in claim 5, wherein the movable mirror is configured such that:

a distance between the mirror location and the second location corresponds to the trench depth.

* * * * *